United States Patent
Oyamada

(10) Patent No.: US 8,853,934 B2
(45) Date of Patent: Oct. 7, 2014

(54) LIGHT-EMITTING DEVICE

(71) Applicants: Citizen Electronics Co., Ltd., Fujiyoshida (JP); Citizen Holdings Co., Ltd., Nishi-Tokyo (JP)

(72) Inventor: Nodoka Oyamada, Fujiyoshida (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/651,805

(22) Filed: Oct. 15, 2012

(65) Prior Publication Data

US 2013/0093313 A1  Apr. 18, 2013

(30) Foreign Application Priority Data

Oct. 13, 2011 (JP) ................................. 2011-226122

(51) Int. Cl.
*H01J 1/62* (2006.01)
*H01J 63/04* (2006.01)
*H01L 27/32* (2006.01)
*F21K 99/00* (2010.01)
*H01L 33/50* (2010.01)
*H01L 33/54* (2010.01)
*H01L 51/50* (2006.01)

(52) U.S. Cl.
CPC ............. *H01L 33/505* (2013.01); *H01L 33/508* (2013.01); *H01L 33/54* (2013.01); *H01L 2933/0041* (2013.01); *H01L 27/322* (2013.01); *H01L 51/5036* (2013.01); *F21K 9/56* (2013.01)
USPC ............ 313/501; 313/503; 313/506; 313/512

(58) Field of Classification Search
CPC ................ H01L 33/501–33/507; H01L 33/50; H01L 27/322; H01L 27/14621; H01L 27/3206; H01L 31/02162; H01L 51/5036; H01L 22/24; H01L 2933/0041; H01L 31/055; H01L 31/02322; H01L 33/54; F21K 9/56
USPC ............. 313/498–512; 252/301.4 F, 301.4 R
See application file for complete search history.

(56) References Cited

U.S. PATENT DOCUMENTS 7,334,907 B2    2/2008  Nagayama
8,294,357 B2 *  10/2012 Washizu et al. ............... 313/501

(Continued)

FOREIGN PATENT DOCUMENTS

JP    200719096 A    1/2007
JP    2010192629 A   9/2010

*Primary Examiner* — Nimeshkumar Patel
*Assistant Examiner* — Jose M Diaz
(74) *Attorney, Agent, or Firm* — Browdy and Neimark, PLLC

(57) ABSTRACT

A light-emitting device includes a phosphor plate including an upper surface, a lower surface opposite to the upper surface, a peripheral side surface extending between a peripheral edge of the upper surface and a peripheral edge of the lower surface of the phosphor plate, a light-emitting element including an upper surface, a lower surface opposite to the upper surface, a peripheral side surface extending between a peripheral edge of the upper surface and a peripheral edge of the lower surface of the light-emitting element. The lower surface of the phosphor plate includes a concave that is filled with an adhesive and the lower surface of the phosphor plate is disposed on the upper surface of the light-emitting element. The phosphor plate may contain a first phosphor, and the adhesive filled in the concave that is provided at the lower surface of the phosphor plate may include a second phosphor.

19 Claims, 11 Drawing Sheets

(56) References Cited

U.S. PATENT DOCUMENTS

| | | | |
|---|---|---|---|
| 8,330,361 B2 * | 12/2012 | Kim | 313/512 |
| 8,395,312 B2 * | 3/2013 | Hum | 313/501 |
| 8,405,112 B2 * | 3/2013 | Okazaki | 257/98 |
| 8,405,304 B2 * | 3/2013 | Choi et al. | 313/506 |
| 8,436,527 B2 * | 5/2013 | Mitsuishi et al. | 313/501 |
| 8,450,921 B2 * | 5/2013 | Hsieh et al. | 313/498 |
| 8,487,525 B2 * | 7/2013 | Lee | 313/501 |
| 8,513,872 B2 * | 8/2013 | Annen et al. | 313/501 |
| 8,547,010 B2 * | 10/2013 | Jagt | 313/501 |
| 2003/0168643 A1 * | 9/2003 | Mitomo et al. | 252/500 |
| 2010/0264448 A1 * | 10/2010 | Choi et al. | 257/98 |
| 2012/0037933 A1 * | 2/2012 | Roth et al. | 257/88 |
| 2012/0267999 A1 * | 10/2012 | Sakuta et al. | 313/503 |
| 2013/0010456 A1 * | 1/2013 | Ishii et al. | 362/97.1 |
| 2013/0069525 A1 * | 3/2013 | Imai | 313/512 |
| 2013/0114242 A1 * | 5/2013 | Pickard et al. | 362/84 |
| 2013/0127328 A2 * | 5/2013 | Ishihara et al. | 313/498 |

* cited by examiner

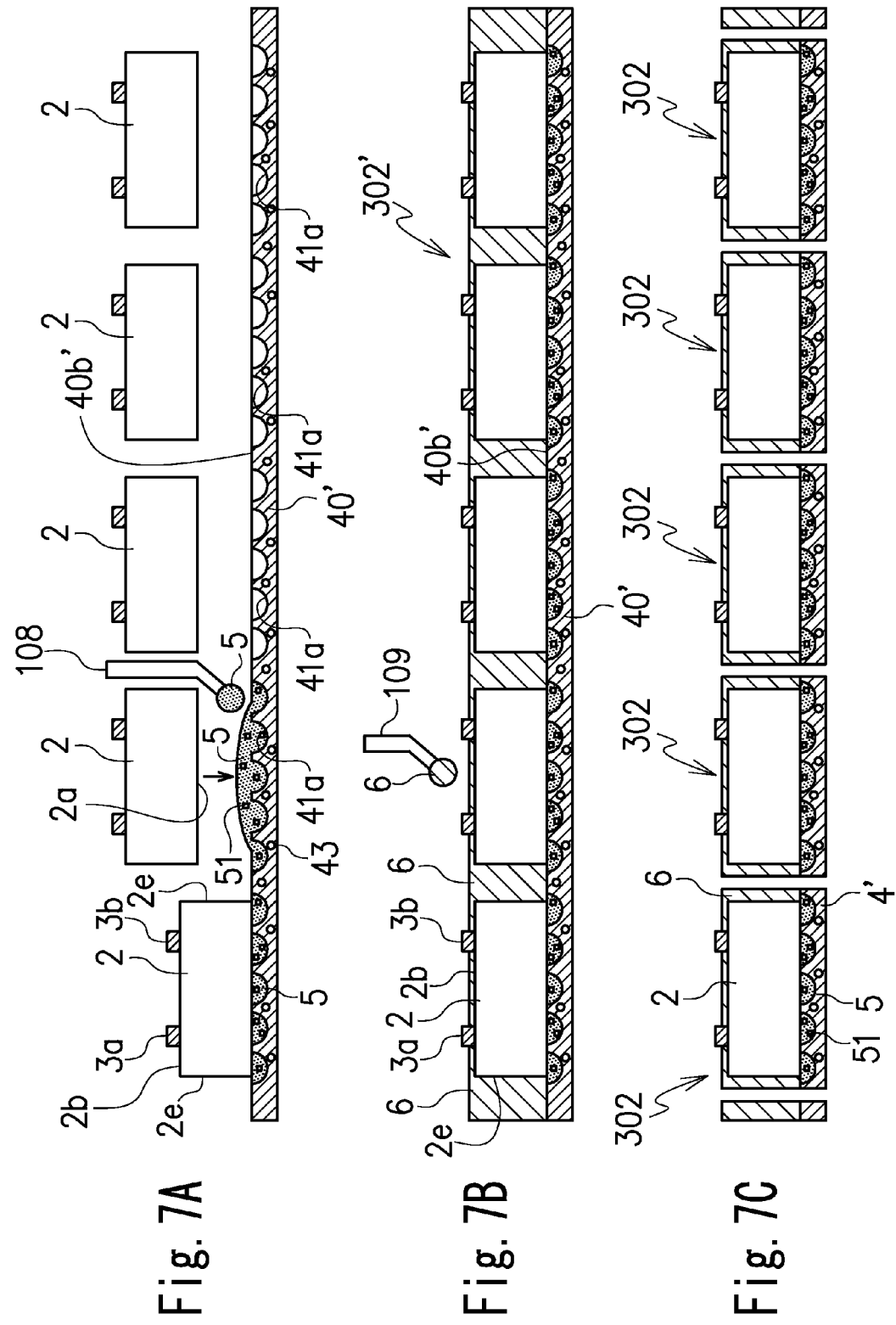

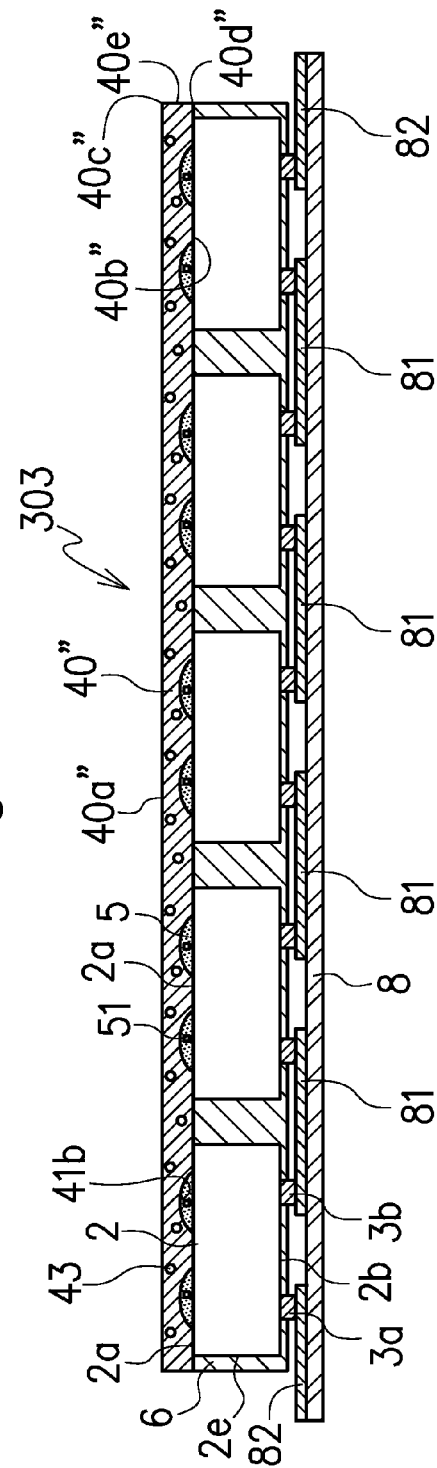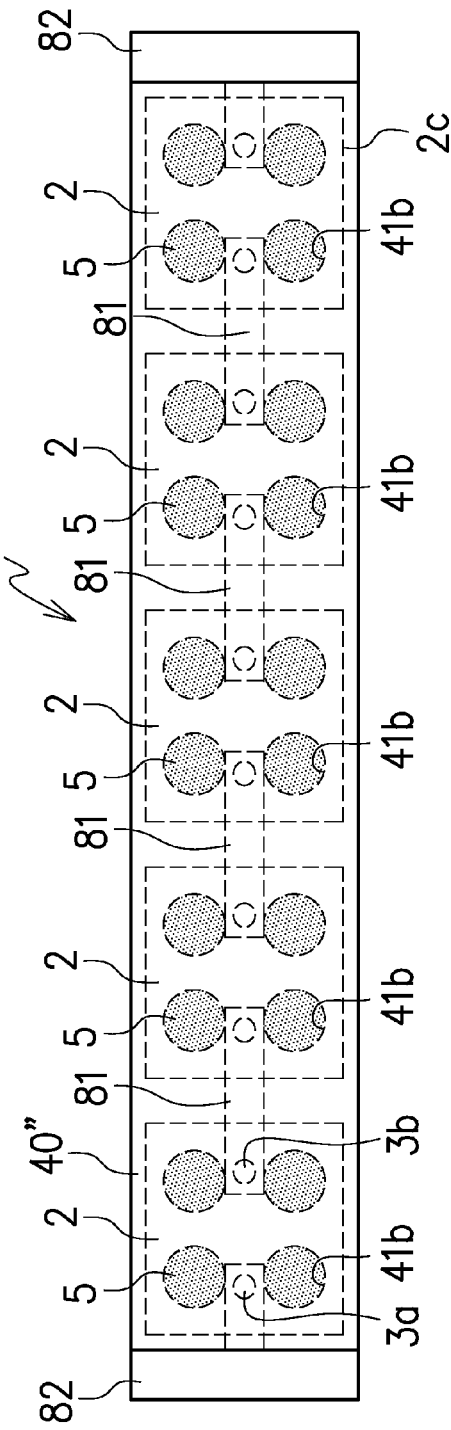

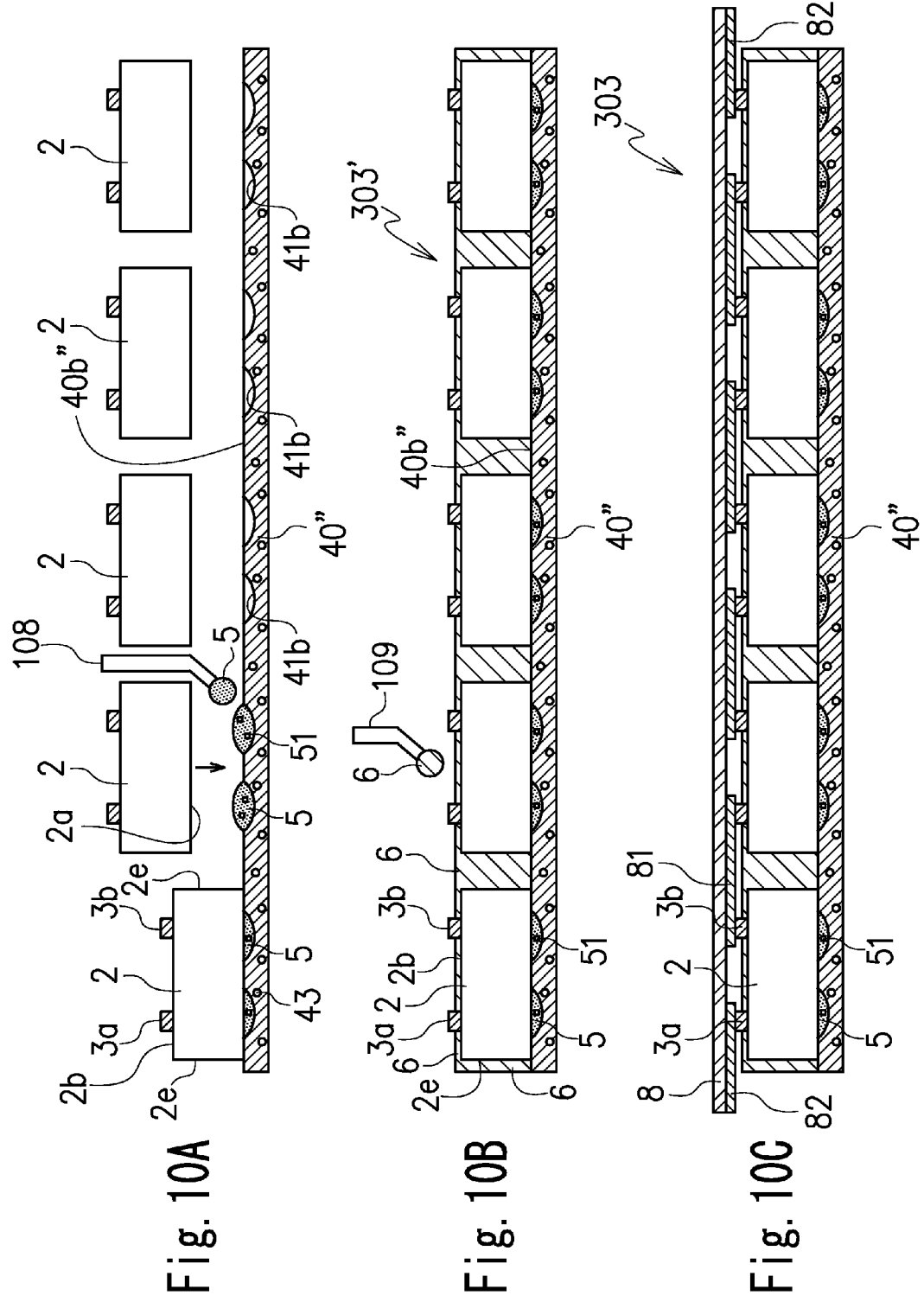

LIGHT-EMITTING DEVICE

CROSS-REFERENCE TO RELATED APPLICATION

This application is based on and claims the priority benefit of Japanese Patent Application No. 2011-226122, filed on Oct. 13, 2011, the disclosure of which is incorporated herein by reference in its entirety.

BACKGROUND OF THE INVENTION

1. Field of the Invention

The present invention relates to a light-emitting device including a light-emitting element such as a light-emitting diode element (LED element), more specifically to a light-emitting device including a phosphor plate provided on a light-emitting surface of a light-emitting element.

2. Description of the Related Art

In recent years, as light sources for light-emitting device, light-emitting diode element(s) (hereinafter referred to as LED element(s)) have been widely used. The LED elements started to have been widely used for general lightings, backlights of color displays of various electronic devices, illuminations and so on, because the LED elements can have a longer service life, excellent drive characteristics, more efficient color of light with a smaller size, compared with an old-established light source such as an incandescent lamp.

Recently, there are proposed light-emitting devices configured to emit light emitted from the LED element upward by covering a periphery of the LED element with a reflective white resin (for reference, see JP2010-192629A and JP2007-19096A).

FIGS. 11A to 11D illustrate a manufacturing process of a light-emitting device 100 described in JP2010-192629A.

FIG. 11A illustrates a process in which an LED element 101 is mounted on an upper surface of a substrate 107 through electrically conductive members 106a and 106b, a frame 109 is disposed to surround the LED element 101, and a space between the LED element 101 and the frame 109 is filled with a first light-reflective white resin 104.

FIG. 11B illustrates a process in which a transparent adhesive 103 is applied to an upper surface of the LED element 101 to adhere a light-transmitting member 102 to the upper surface.

FIG. 11C illustrates a process in which the light-transmitting member 102 is adhered to the upper surface of the LED element 101 through the transparent adhesive 103.

FIG. 11D illustrates a process in which a second white resin 105 is dropped on the substrate 107 by a dropping device 108 to cover a periphery of the light-transmitting member 102 and a peripheral side surface by the second white resin 105.

In this way, the light-emitting device 100 is completed by covering the periphery of the LED element 101 with the first white resin 104 and covering a peripheral side surface of the first white resin 104 and a peripheral side surface of the light-transmitting member 102 with the second white resin 105.

FIG. 12 illustrates a light-emitting device 200 described in JP2007-19096A. The light-emitting device 200 includes a case 203 having a hollow 203a, an LED element 201 mounted on a pair of upper electrodes 205a, 205b provided on a bottom surface of the hollow 203a through conductive members 206a, 206b, a light-reflective white resin 204 with which the hollow 203a of the case 203 is filled and a periphery of the LED element 201 is covered, and a sheet-shaped phosphor layer 202 adhered to an upper surface of the LED element 201.

The white resin in each of the light-emitting devices 100 and 200 reflects light emitted from the LED element 101, 201 to be directed to the upper surface side of the light-emitting device, and has a function to enhance light-harvesting property and light-emitting effect.

As the white resin, it is possible to use a material in which a reflective filler such as oxidized titanium, silica dioxide, zirconium dioxide, alumina, boron nitride and so on is mixed in a coating material such as silicone resin, epoxy resin, acryl resin and so on.

However, in the light-emitting devices 100 and 200 disclosed in JP2010-192629A and JP2007-19096A, the white resin 104 (204) is filled at the side surface side of the LED element 101 (201) mounted on the substrate 107 or the case 203 in a state where the light-emitting surface of the LED element 101 (201) is exposed, and after the white resin 104 (204) is hardened, the light-transmitting member 102 or the phosphor layer 202 is adhered to the light-emitting surface of the LED element 101 (201). Consequently, there is possibility that the white resin 102 (204) is attached to the light-emitting surface of the LED element 101 (201). If the white resin 102 (204) is attached to the light-emitting surface, a process to remove the white resin is required, there is a problem in that productivity is reduced.

Furthermore, in the light-emitting devices 100 and 200, because the light-transmitting member 102 or the phosphor layer 202 is adhered to the light-emitting surface of the LED element 101 (201), there is a possibility that the light-transmitting member 102 or the phosphor layer 202 is detached from the light-emitting surface by the deterioration and so on of the adhesive.

In addition, because the light-transmitting member 102 or the phosphor layer 202 has a thickness, there is possibility that a yellow ring occurs.

SUMMARY OF THE INVENTION

The present invention is proposed in view of such conventional devices as above-described. A light-emitting device according to an embodiment of the present invention may include a phosphor plate that includes an upper surface, a lower surface opposite to the upper surface, a peripheral side surface extending between a peripheral edge of the upper surface and a peripheral edge of the lower surface of the phosphor plate; a light-emitting element that includes an upper surface, a lower surface opposite to the upper surface of the light-emitting element, a peripheral side surface extending between a peripheral edge of the upper surface and a peripheral edge of the lower surface of the light-emitting element. The lower surface of the phosphor plate may include one or more concaves. The lower surface of the phosphor plate is disposed on the upper surface of the light-emitting element. The one or more concaves included in the lower surface of the phosphor plate 4 may be filled with an adhesive.

BRIEF DESCRIPTION OF THE DRAWINGS

FIG. 7A is a process view that bonds a light-emitting element and a phosphor plate, in a manufacturing process of the light-emitting device shown in FIG. 5.

FIG. 7B is a process view that covers a peripheral side surface and a lower surface of the light-emitting element with a white resin, in the manufacturing process of the light-emitting device shown in FIG. 5.

FIG. 7C is a process view that divides a collecting light-emitting device into individual light-emitting elements, in the manufacturing process of the light-emitting device shown in FIG. 5.

FIG. 8 is a sectional view of a light-emitting device according to a fourth embodiment of the present invention.

FIG. 9 is a plan view of the light-emitting device shown in FIG. 8.

FIG. 10A is a process view that bonds a light-emitting element and a phosphor plate, in a manufacturing process of the light-emitting device shown in FIG. 8.

FIG. 10B is a process view that covers a peripheral side surface and a lower surface of the light-emitting element with a white resin, in the manufacturing process of the light-emitting device shown in FIG. 8.

FIG. 10C is a process view that divides a collecting light-emitting device into individual light-emitting elements, in the manufacturing process of the light-emitting device shown in FIG. 8.

DETAILED DESCRIPTION OF THE EMBODIMENTS

Figure 1:
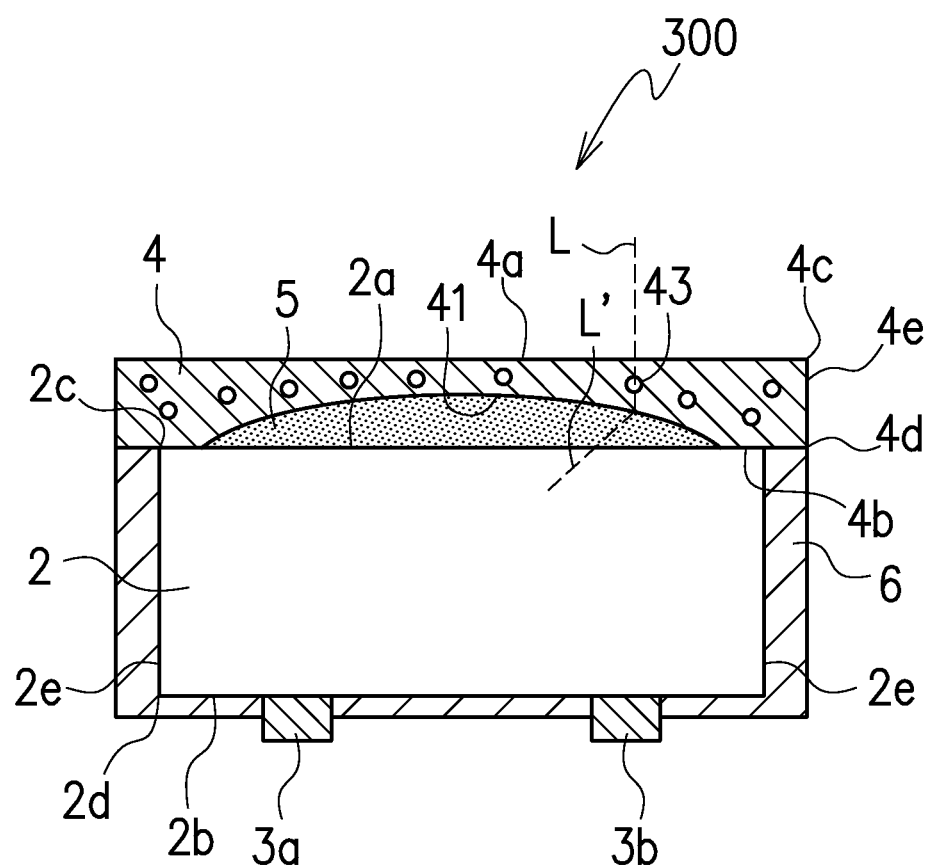
FIG. 1 is a sectional view of a light-emitting device according to a first embodiment.

The following detailed description refers to the accompanying drawings, which illustrate embodiments of the present invention. Other embodiments including different structures and/or operation do not depart from the scope of the present invention.

Embodiments of the invention are described with reference to drawings included herewith. Like reference numbers refer to like structures throughout. It should be noted that the drawings are schematic in nature. Not all parts are always shown to scale.

A light-emitting device 300, 301, 302, 303 according to an embodiment of the present invention may include a phosphor plate 4, 4', 40" that includes an upper surface 4a, 4a', 40a", a lower surface 4b, 4b', 40b" opposite to the upper surface 4a, 4a', 40a", a peripheral side surface 4e, 4e', 40e" extending between a peripheral edge 4c, 4c', 40c" of the upper surface 4a, 4a', 40a" and a peripheral edge 4d, 4d' 40d" of the lower surface 4b, 4b', 40b" of the phosphor plate 4, 4', 40"; a light-emitting element 2 that includes an upper surface 2a, a lower surface 2b opposite to the upper surface 2a of the light-emitting element 2, a peripheral side surface 2e extending between a peripheral edge 2c of the upper surface 2a and a peripheral edge 2d of the lower surface 2b of the light-emitting element 2. The lower surface 4b, 4b', 40b" of the phosphor plate 4 may include one or more concaves. The lower surface 4b, 4b', 40b" of the phosphor plate 4 is disposed on the upper surface 2a of the light-emitting element 2. The one or more concaves included in the lower surface 4b, 4b', 40b" of the phosphor plate 4 may be filled with an adhesive 5.

Figure 2:
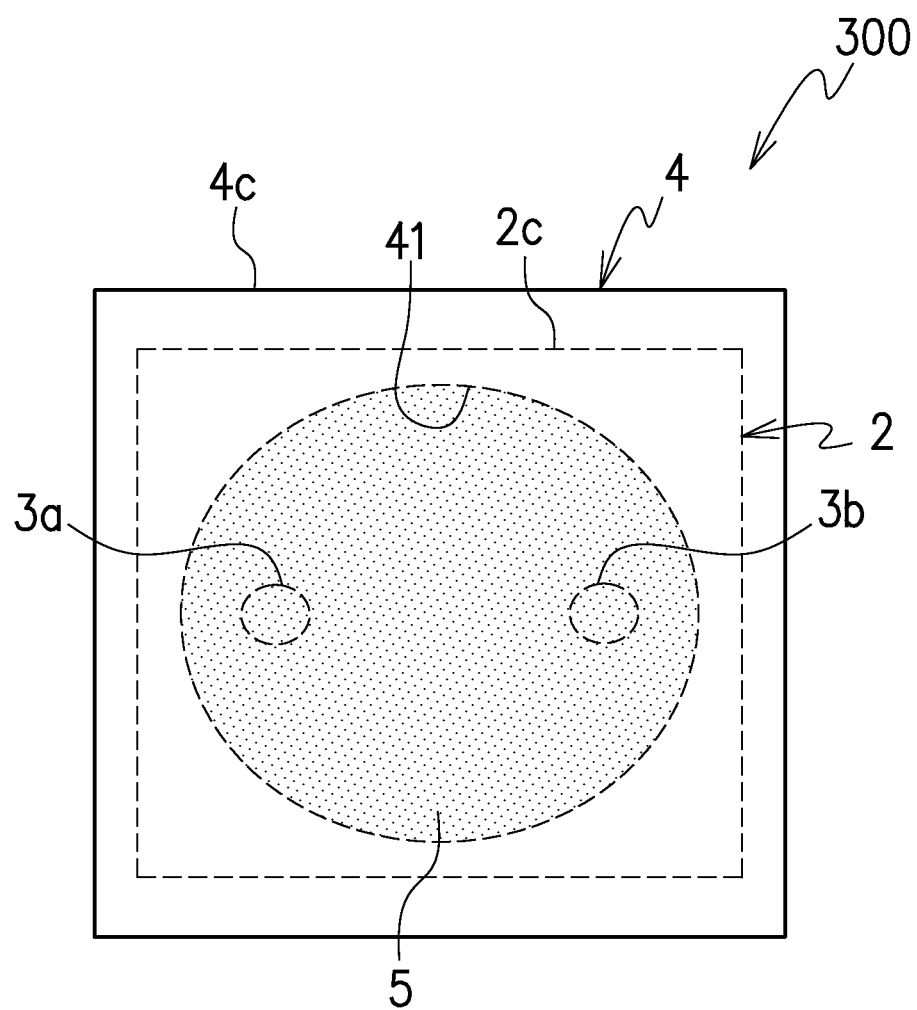
FIG. 2 is a plan view of the light-emitting device shown in FIG. 1.
Figure 3:
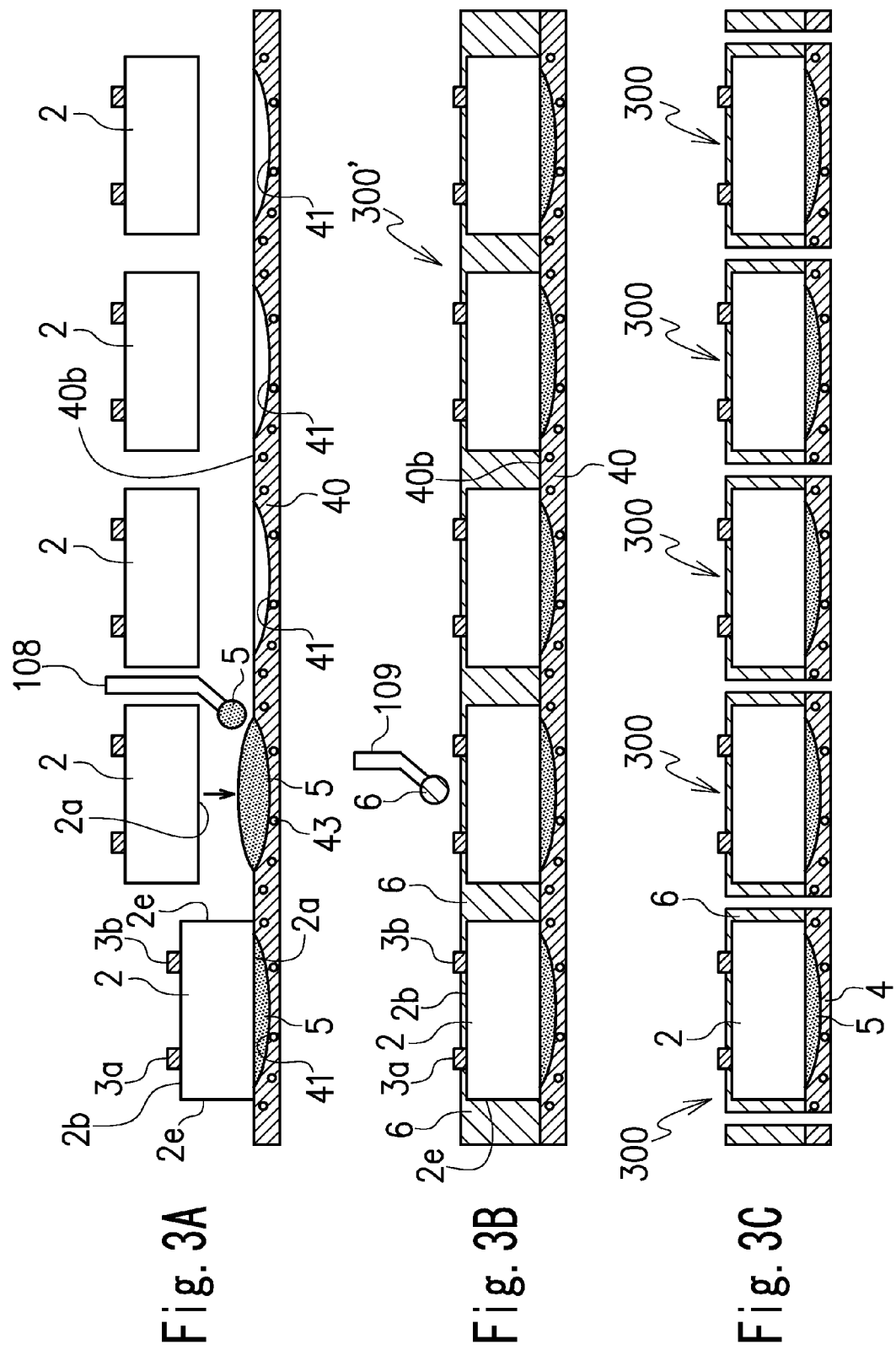
FIG. 3A is a process view that bonds an upper surface of a light-emitting element and a lower surface of a phosphor plate, in a manufacturing process of the light-emitting device shown in FIG. 1.
FIG. 3B is a process view that covers a peripheral side surface and a lower surface of the light-emitting element with a white resin, in the manufacturing process of the light-emitting device shown in FIG. 1.
FIG. 3C is a process view that divides a collecting light-emitting device into individual light-emitting elements, in the manufacturing process of the light-emitting device shown in FIG. 1.

For more details, FIGS. 1 to 3 illustrate a light-emitting device 300 according to a first embodiment of the present invention.

The light-emitting device 300 according to the first embodiment includes a phosphor plate 4 that includes an upper surface 4a, a lower surface 4b opposite to the upper surface 4a, a peripheral side surface 4e extending between a peripheral edge 4c of the upper surface 4a and a peripheral edge 4d of the lower surface 4b of the phosphor plate 4, a light-emitting element 2 that includes an upper surface 2a configured to be a light-emitting surface, a lower surface 2b opposite to the upper surface 2a, a peripheral side surface 2e extending between a peripheral edge 2c of the upper surface 2a and a peripheral edge 2d of the lower surface 2b of the light-emitting element 2. The light-emitting element 2 includes a p-element electrode 3a and an n-element electrode 3b that are positioned at the lower surface 2b of the light-emitting element 2.

The lower surface 4b of the phosphor plate 4 includes a single concave 41 and the lower surface 4b of the phosphor plate 4 is disposed on the upper surface 2a of the light-emitting element 2. The concave 41 is positioned within the peripheral edge 2c of the upper surface 2a of the light-emitting element 2 in a top plan view. The concave 41 included in the lower surface 4b of the phosphor plate 4 is filled with an adhesive 5. In this embodiment, the adhesive 5 may be transparent. The lower surface 4b of the phosphor plate 4 is adhered to the upper surface 2a of the light-emitting element 2 through the adhesive 5.

The lower surface 4b of the phosphor plate 4 may be larger in area than the upper surface 2a of the light-emitting element 2 with the peripheral edge 4d of the lower surface 4b of the phosphor plate 4 protruding from the peripheral edge 2c of the upper surface 2a of the light-emitting element 2.

The light-emitting device 300 according to the first embodiment further includes a white resin 6 that covers the peripheral side surface 2e and the lower surface 2b of the light-emitting element 2 except the p-element electrode 3a and the n-element electrode 3b positioned at the lower surface 2b of the light-emitting element 2. The white resin 6 is in contact with the lower surface 4b of the phosphor plate at an area of the lower surface 4b of the phosphor plate 4 that protrudes from the peripheral edge 2c of the upper surface 2a of the light-emitting element 2, and the white resin 6 is flush with the peripheral side surface of the phosphor plate at a peripheral side surface of the white resin 6.

As the light-emitting element 2, a light-emitting element that emits various color lights may be used. If, for example, a blue LED element is used as the light-emitting element, because it is made of a GaN material, the blue LED element emits blue light, when a current is applied to the LED element. A p-element electrode 3a and an n-element electrode 3b as a pair of element electrodes are positioned at the lower surface 2b of the light-emitting element 2.

The white resin 6 may be provided to cover the peripheral side surface 2e and the lower surface 2b of the light-emitting element 2 except the p-element electrode 3a and the n-element electrode 3b that are positioned at the lower surface 2b of the light-emitting element 2. A leading end portion of the p-element electrode 3a and a leading end portion of the n-element electrode 3b are configured to appear or protrude from the white resin 6 that covers the lower surface 2b of the light-emitting element 2.

The phosphor plate 4 is adhered to the upper surface 2a of the light-emitting element 2 by the adhesive 5, while the concave 41 is provided in the lower surface 4b of the phosphor plate 4 facing the upper surface 2a of the light-emitting element 2, as shown in FIG. 1.

The concave 41 has a shape that curves inwards in the middle in section, as shown in FIG. 1 and an elliptical shape as viewed in a top plan, as shown in FIG. 2. The concave 41 has an area that covers a large part of the upper surface 2a of the light-emitting element 2, and is positioned within the peripheral edge 2c of the upper surface 2a of the light-emitting element 2 in a top plan view.

In the first embodiment, the adhesive 5 filled in the concave 41 provided in the lower surface 4b of the phosphor plate 4 and bonding the lower surface 4b of the phosphor plate 4 to the upper surface 2a of the light-emitting element 2 is transparent. In this case, it is possible to form the adhesive 5 into a convex shape, because the concave 41 is a concave shape. Accordingly, the adhesive 5 filled in the concave 41 can have a lens effect by a difference between an optical refraction index of the adhesive 5 and an optical refraction index of the phosphor plate 4. As a result, it is possible to prevent a certain color of light of the light-emitting device from appearing in a ring shape.

In addition, the provision of the concave 41 in the phosphor plate 4 makes it possible to increase a bonding intensity by enlarging a connection area between the upper surface 2a of the light-emitting element 2 and the lower surface 4b of the phosphor plate 4.

Moreover, the phosphor plate 4 in the first embodiment includes a transparent resin and a first phosphor 43 which is contained in the transparent resin and comprises phosphor particles of Yttrium Aluminum Garnet (YAG). As the transparent resin, example, silicone resin may be used.

The lower surface 4b of the phosphor plate 4 is larger in area than the upper surface 2a which is the light-emitting surface of the light-emitting element 2, as shown in FIGS. 1 and 2. The peripheral side surface 4e of the phosphor plate 4 extends outside the peripheral side surface 2e of the light-emitting element 2. The white resin 6 that covers the peripheral side surface 2e of the light-emitting element 2 is in contact with the lower surface 4b of the phosphor plate 4 extending outward over the peripheral side surface 2e of the light-emitting element 2 and flush with the peripheral side surface 4e of the phosphor plate 4 at a peripheral side surface of the white resin 6.

A bonding force between the phosphor plate 4 and the white resin 6 is increased at the lower surface 4b extending outward the peripheral side surface 2e of the light-emitting element 2. In addition, it is possible to reduce dispersion of light emitted from the light-emitting element 2 by covering the entire light-emitting element 2 with the phosphor plate 4 and the white resin 6. Consequently, a light-emitting effect from the phosphor plate 4 being in contact with the upper surface 2a which is the light-emitting surface of the light-emitting element 2 is enhanced. Meanwhile, as the white resin 6, for example, silicone resin is used. Red phosphor, green phosphor, blue phosphor or the like is contained in the silicone resin used as the white resin 6, and a reflective filler such as silica dioxide or the like may be further added.

Next, a manufacturing process of the light-emitting device 300 is described with reference to FIGS. 3A to 3C.

FIG. 3 illustrates a bonding process that bonds the upper surface 2a of the light-emitting element 2 to the lower surface 4b of the phosphor plate 4. A large phosphor plate 40 divided in a plurality of phosphor plates 4 is prepared to make the phosphor plate 4 used in the bonding process. An upper surface 2a of each of a plurality of light-emitting elements 2 is together bonded to a lower surface 40b of the phosphor plate 40.

A plurality of concaves 41 are provided at predetermined intervals in the phosphor plate 40, and each of the concaves 41 is filled with an adhesive 5 by a dropping device 108. The plurality of light-emitting elements 2 are bonded to the phosphor plate 40 by pressing the upper surfaces 2a which are light-emitting surfaces of the light-emitting elements 2 to the adhesives 5 filled in the concaves 41 of the phosphor plate 40. Each of the light-emitting elements 2 includes a lower surface 2b opposite to the upper surface 2a bonded to the phosphor plate 40.

FIG. 3B illustrates a covering process that covers a peripheral side surface 2e and the lower surface 2b of each of the light-emitting elements 2 with a white resin 6.

In the covering process, a space formed by the peripheral side surfaces 2e between the adjacent light-emitting elements 2 and a part of the lower surface 40b of the phosphor plate 40 is filled with a white resin material by use of a dropping device 109. In this covering process, the peripheral side surfaces 2e and the lower surfaces 2b of the plurality of light-emitting elements 2 except a p-element electrode 3a and an n-element electrode 3b as a pair of element electrodes provided on the lower surface 2b of each light-emitting element 2 are covered with the white resin 6.

In this way, it is possible to complete a collecting light-emitting device 300' in which the plurality of light-emitting elements 2 are mounted on the large phosphor plate 40 from which the plurality of phosphor plates 4 can be acquired.

FIG. 3C illustrates a dicing (singulating) process that dices the collecting light-emitting device 300' at the spaces among the light-emitting elements 2 and divides it in individual light-emitting devices 300.

In the dicing process, the light-emitting devices 300 each including a light-emitting element 2, a phosphor plate 4, an adhesive 5 and a white resin 6 are acquired by moving a dicing blade (not shown) on the collecting light-emitting device 300' while rotating the dicing blade and dicing the white resin 6 filled in the spaces between the adjacent light-emitting elements 2 and the large phosphor plate 40.

Next, a light-emitting operation of the light-emitting device 300 is described. In this case, an example in which a blue LED element is used as the light-emitting element 2 and YAG phosphor particles are used as the first phosphor 43 contained in the phosphor plate 4 is described.

As shown in FIG. 1, a part of blue light emitted from the upper surface 2a of the light-emitting element 2 excites the YAG phosphor which is the first phosphor 43 contained in the phosphor plate 4 to emit yellow light L, and the yellow light L is emitted to an exterior.

More specifically, in FIG. 1, blue light L' directed obliquely upward from the upper surface 2a of the light-emitting element 2 is refracted by the adhesive 5 filled in the concave 41 provided in the lower surface 4b of the phosphor plate 4 and is formed in light to be directed to approximately right above the upper surface 4a of the phosphor plate 4. Also, another part of the blue light (including blue light L) emitted from the light-emitting element 2 is not converted by the first phosphor 43 and focused by the adhesive 5 filled in the concave 41 provided in the lower surface 4b of the phosphor plate 4. The phosphor-converted light and blue light through the adhesive 5 that works as a lens are focused, and therefore, appear a white light without causing a ring shape of a certain color of light.

Meanwhile, a center of the concave 41 provided in the lower surface 4b of the phosphor plate 4 coincides with a center of the upper surface 2a of the light-emitting element 2 as viewed from above to enhance the lens effect. In the first embodiment, the number of the concave 41 provided in the lower surface 4b of the phosphor plate 4 is one.

On the other hand, blue light emitted from the peripheral side surface 2e of the light-emitting element 2 is reflected on the white resin 6 that covers the peripheral side surface 2e of the light-emitting element 2 and returned to the light-emitting element 2. However, a part of the blue light is introduced from an upper portion of the white resin 6 passing through a part of the lower surface 4b of the phosphor plate 4 being in contact with the white resin 6 into the phosphor plate 4 and excites the first phosphor 43 to be yellow-tinged light, and the yellow-tinged light is emitted to an exterior.

In this way, because light emitted from the peripheral side surface 2e of the light-emitting element 2 is also emitted to the exterior passing through the phosphor plate 4, the light emitted from the light-emitting element 2 can effectively be used, and hence an amount of light emitted from the light-emitting device 300 can be increased. In addition, because the obliquely upward emitted from the light-emitting element 2 is refracted to approximately right above the upper surface 2a of the light-emitting element 2 by the lens effect of the adhesive 5 filled in the concave 41 of the phosphor plate 4, a yellow ring is prevented from being generated.

Figure 4:
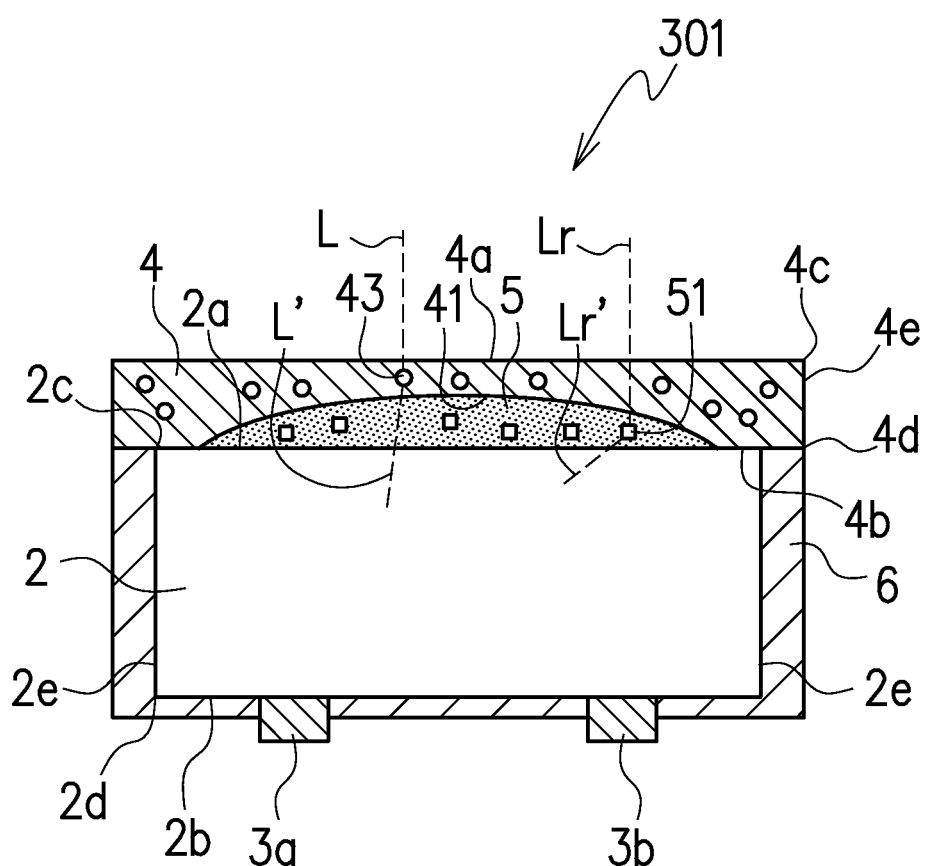
FIG. 4 is a sectional view of a light-emitting device according to a second embodiment of the present invention.

FIG. 4 illustrates a light-emitting device according to a second embodiment of the present invention.

The phosphor plate 4 of the light-emitting device according to the first embodiment includes the first phosphor 43, whereas the light-emitting device 301 according to the second embodiment further includes a second phosphor 51 which is contained in the adhesive 5 filled in the concave 41 of the phosphor plate 4. Consequently, the phosphor plate 4 in the second embodiment includes the first phosphor 43, the adhesive 5 that is filled in the concave 41 provided in the lower surface 4b of the phosphor plate 4, and the second phosphor 51 contained in the adhesive 5. The first phosphor 43 contained in the phosphor plate 4 is different from the second phosphor 51 contained in the adhesive 5. For a light-emitting device to emit white light, a blue LED as a light-emitting element 2 may be used with a yellow phosphor, or with a green and yellow SiAlON phosphor and a red $CaAlSiN_3$-based (CASN) phosphor. The first phosphor 43 contained in the phosphor plate 4 may belong to the garnet group; for example, a yttrium aluminum garnet (YAG) phosphor, and/or a lutetium aluminum garnet (LuAG) phosphor. Also, β-SiAlON that shifts light emitted from a light-emitting element 2 toward light in a green region of spectrum may be used as the first phosphor. Furthermore, as the second phosphor 51 contained in the adhesive 5 filled in the concave 41 provided at the lower surface 4b of the phosphor plate 4, SCASN and/or CASN whose general formula is $CaAlSiN_3$:Eu may be used. Also, α-SiAlON that shifts light emitted from a light-emitting element 2 toward light in a red region of spectrum may be used as the second phosphor. Because the light-emitting device 301 in the second embodiment is substantially the same as the light-emitting device in the first embodiment, except the provision of the second phosphor 51, a further detailed description of the light-emitting device 301 in the second embodiment is omitted.

In the light-emitting device 301 according to the second embodiment, in addition to the YAG phosphor particles as the first phosphor 43 contained in the phosphor plate 4, the second phosphor 51 which converts the light emitted from the light-emitting element 2 into light of different color from that converted by the first phosphor 43 is contained in the adhesive 5. For example, by mixing the α-SiAlON phosphor particles that shift light emitted from a light-emitting element 2 toward light in a red region of spectrum as the second phosphor 51 in the adhesive 5, it is possible to enhance color rendering properties of the light-emitting device 301.

More specifically with reference to FIG. 4, blue light L' which is a part of the blue light emitted from the upper surface 2a of the light-emitting element 2 excites the YAG phosphor as the first phosphor 43 contained in the phosphor plate 4 to become the yellow light L and, the yellow light is emitted to an exterior. On the other hand, blue light Lr' which is a part of the blue light emitted from the upper surface 2a of the light-emitting element 2 excites the α-SiAlON phosphor particles as the second phosphor 51, for example. As excited by the second phosphor 51 is mixed in the adhesive 5 filled in the concave 41 of the lower surface 4b of the phosphor plate 4, the blue light Lr' is shifted toward light Lr in a red region of spectrum and emitted upward to an exterior of the light-emitting device 301.

Because there is also blue light emitted to the exterior without exciting the first phosphor 43 and the second phosphor 51, it is possible for a person to view white color having high color rendering properties by mixture of lights of various wavelengths such as the blue light, the yellow light, the red light and so on.

Figure 5:
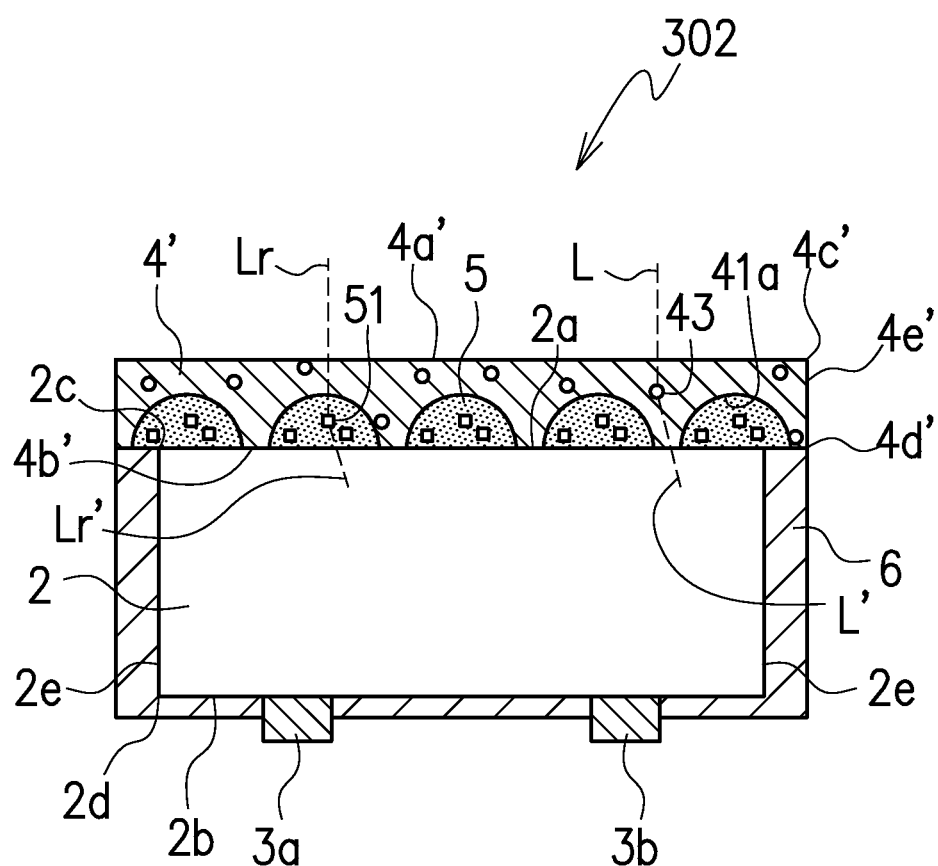
FIG. 5 is a sectional view of a light-emitting device according to a third embodiment of the present invention.
Figure 6:
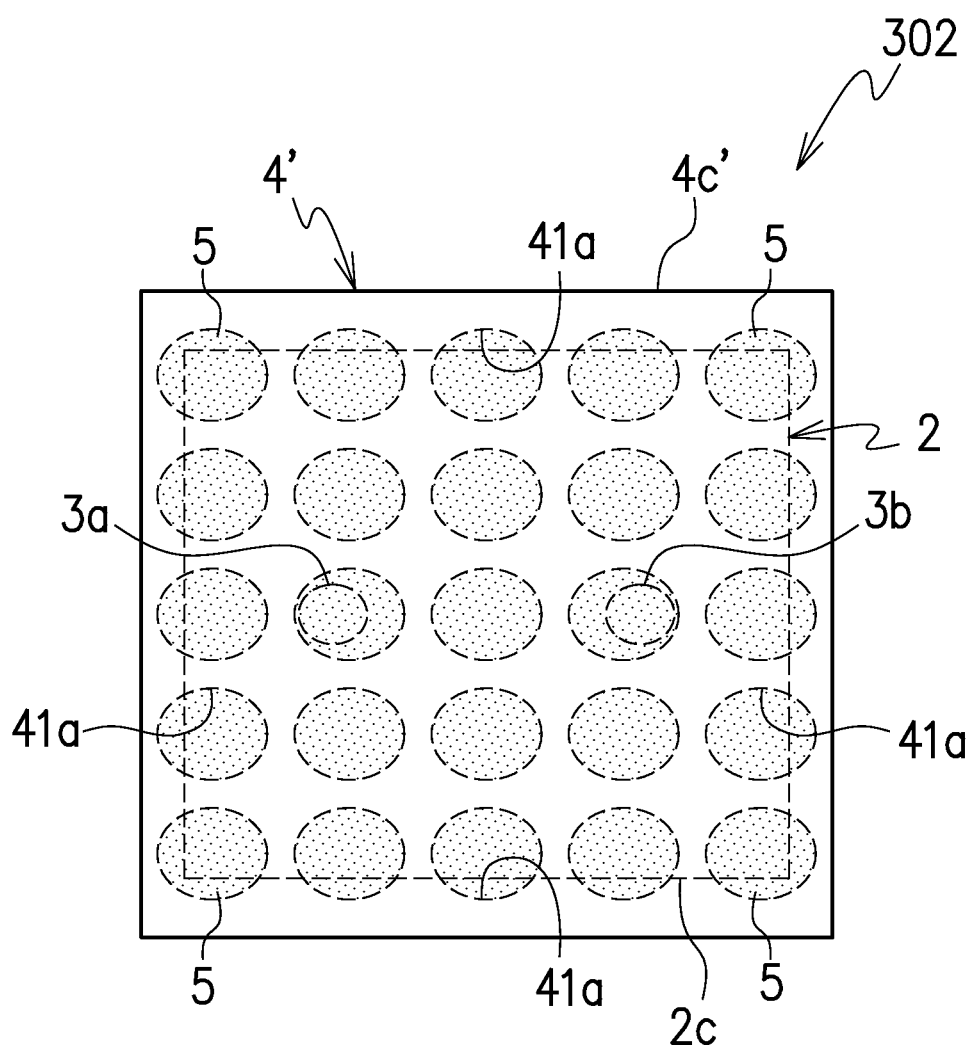
FIG. 6 is a plan view of the light-emitting device shown in FIG. 5.
Figure 11A:
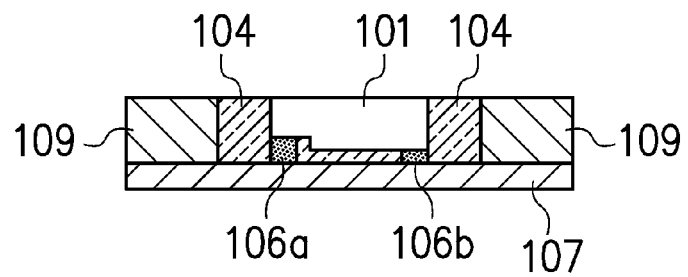
FIG. 11A is a process view that covers a peripheral side surface of a light-emitting element mounted on a substrate with a first white resin, in a manufacturing process of a conventional light-emitting device.
Figure 11B:
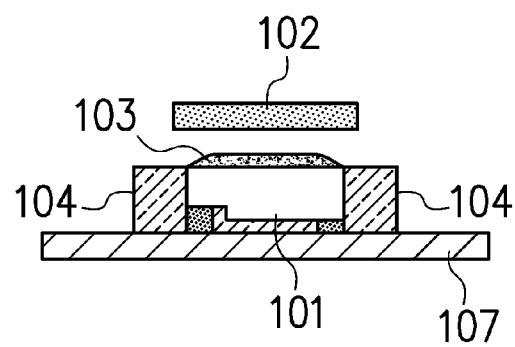
FIG. 11B is a process view that applies a transparent adhesive on an upper surface of the light-emitting element, in the manufacturing process of the conventional light-emitting device.
Figure 11C:
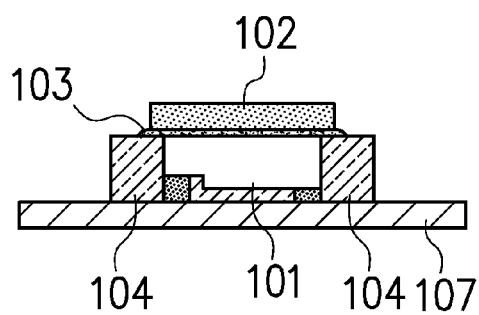
FIG. 11C is a process view that bonds a light-transmitting member on the upper surface of the light-emitting element, in the manufacturing process of the conventional light-emitting device.
Figure 11D:
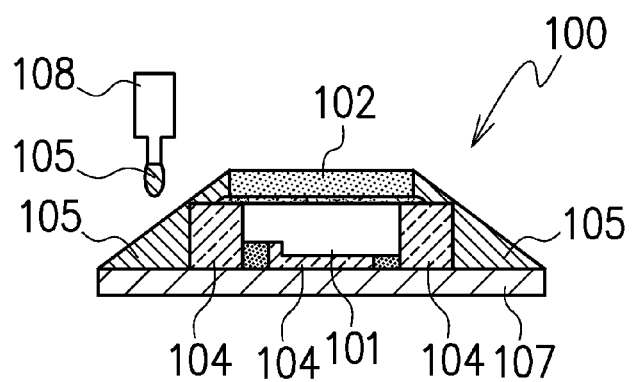
FIG. 11D is a process view that covers the entirety of the light-transmitting member including a peripheral side surface with a second white resin, in the manufacturing process of the conventional light-emitting device.
Figure 12:
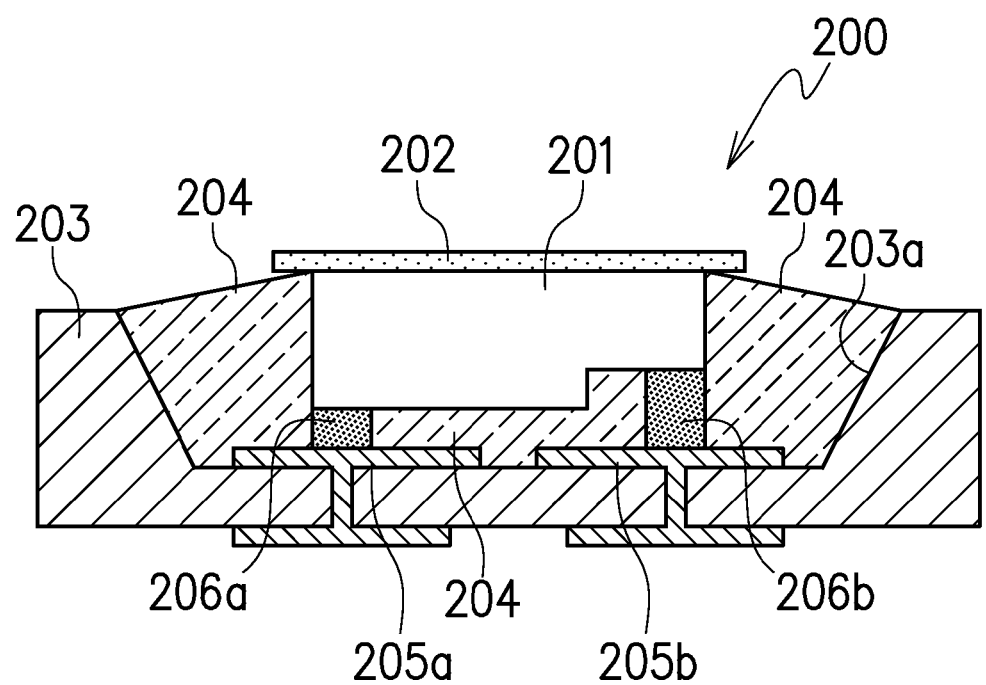
FIG. 12 is a sectional view of another conventional light-emitting device.

FIGS. 5 and 6 illustrate a light-emitting device according to a third embodiment of the present invention. The light-emitting device 302 includes a phosphor plate 4' that includes an upper surface 4a', a lower surface 4b' opposite to the upper surface 4a', a peripheral side surface 4e' extending between a peripheral edge 4c' of the upper surface 4a' and a peripheral edge 4d' of the lower surface 4b' of the phosphor plate 4; a light-emitting element 2 including an upper surface 2a, a lower surface 2b opposite to the upper surface 2a, a peripheral side surface 2e extending between a peripheral edge 2c of the upper surface 2a and a peripheral edge 2d of the lower surface 2b of the light-emitting element 2. The lower surface 4b' of the phosphor plate 4' includes concaves 41a and the lower surface 4b' of the phosphor plate 4' is disposed on the upper surface 2a of the light-emitting element 2. As the plurality of concaves 41a provided at the lower surface 4b' of the phosphor plate 4' are filled with an adhesive, the lower surface 4b' of the phosphor plate 4' and the upper surface 2a of the light-emitting element 2 is firmly adhered to each other at positions where the concaves 41a are provided. In this embodiment, the concaves 41a are lined up along the peripheral edge 2c of the upper surface 2a of the light-emitting element 2 in a top plan view. The phosphor plate 4' contains a first phosphor 43, and the adhesive 5 that is filled in the concaves 41a of the lower surface 4b' of the phosphor plate 4' contains a second phosphor 51. The first phosphor 43 contained in the phosphor plate 4' is different from the second phosphor 43 contained in the adhesive 5 that is filled in the concaves 41a of the lower surface 4b' of the phosphor plate 4'.

The light-emitting device 302 according to the third embodiment differs from the light-emitting device 300 in the first embodiment and the light-emitting device 301 in the second embodiment in that a plurality of concaves 41a are provided in a lower surface 4b' of a phosphor plate 4' facing the upper surface 2a which is the light-emitting surface of the light-emitting element 2. The lower surface 4b' of the phosphor plate 4' is placed on the upper surface 2a of the light-emitting element 2, and a center of one concave of the plurality of concaves 41a may be coincided with a center of the upper surface 2a of the light-emitting element 2. In addition, the concaves 41a may be configured to be lined up along the peripheral edge 2c of the upper surface 2a of the light-emitting element 2.

The number of the concaves 41a differs depending on a size of the phosphor plate 4' or a size of individual concaves 41a, in the third embodiment, for example, a total of twenty five concaves 41a in which five concaves are arranged in each of vertical and horizontal directions are provided, as shown in FIG. 6.

In the third embodiment, all of the concaves 41a have the same shape in which each of the concaves has a semi-spherical shape in section, as shown in FIG. 5 and an elliptical shape in top plan, as shown in FIG. 6. Each concave 41a is filled with an adhesive 5. The adhesive 5 contains a second phosphor 51. In the third embodiment, the light-emitting device 302 in which α-SiAlON phosphor or other phosphors such as SCASN phosphor or CASN phosphor that shift light emitted from a light-emitting element 2 toward light in a red region of spectrum may be used as the second phosphor 51.

Meanwhile, YAG phosphor or LuAG phosphor may be used particles as the first phosphor 43. The first phosphor 43 is mixed in the phosphor plate 4', similarly to the previous embodiments. Moreover, because the light-emitting device 302 in the third embodiment is similar to the light-emitting device 300 in the first embodiment in configuration, except that the plurality of concaves 41a are provided in the lower surface 4b' of the phosphor plate 4', and except that the phosphor plate 4' includes an upper surface 4a', a peripheral side surface 4c' of the upper surface 4a', a peripheral side surface 4d' of the lower surface 4b', and a peripheral side surface 4e', identical reference numbers are attached to similar parts to that in the first embodiment, and a detailed description is omitted.

In the third embodiment, all of the concaves 41a are formed in the same shape. However, it is not necessary to form the concaves in the same shape. That is to say, a shape of the concave is not limited to the fact that each of the concaves has a semi-spherical shape in section and an elliptical shape in top plan. For example, a manner in which radially extending grooves from a center of the phosphor plate 4' toward a periphery thereof are provided on the phosphor plate 4', and a semi-spherical concave 41a is formed at a leading end of each of the grooves may be adopted.

FIGS. 7A to 7C illustrate a manufacturing process of the light-emitting device 302 according to the third embodiment.

FIG. 7A illustrates a bonding process that bonds upper surfaces 2a of a plurality of light-emitting elements 2 to a lower surface 40b' of the phosphor plate 40' in which a plurality of concaves 41a are provided. A large phosphor plate 40' used in the manufacturing process is configured to be capable of taking out a plurality of phosphor plate 4'. FIG. 7B illustrates a covering process that covers the peripheral side surface 2e and the lower surface 2b of each of the light-emitting elements 2 with the white resin material of which is supplied from the dropping device 109 to form a collecting light-emitting device 302' in which the plurality of light-emitting elements 2 are adhered on the phosphor plate 40'. FIG. 7C illustrates a dicing process that dices the collecting light-emitting device 302' and divides it into individual light-emitting devices 300.

Because the bonding process, the covering process and the dicing process are the approximately same as the manufacturing process in the previous first embodiment, identical reference numbers are attached to similar parts to that in the first embodiment, a detailed description is omitted.

A light-emitting operation of the light-emitting device 302 structured as mentioned above is the approximately same as the light-emitting device 301 according to the second embodiment in which the YAG phosphor as the first phosphor 43 are contained in the phosphor plate 4' and the α-SiAlON phosphor or other phosphors such as SCASN phosphor or CASN phosphor that shift light emitted from a light-emitting element 2 toward light in a red region of spectrum may be used as the second phosphor 51 contained in the adhesive 5 filled in each concave 41a. That is to say, as shown in FIG. 5, there is blue light L' which is a part of blue light emitted from the upper surface 2a as the light-emitting surface of the light-emitting element 2 and excites the YAG phosphor as the first phosphor 43 that is contained in the phosphor plate 4' to emit yellow light L, and the yellow light L is emitted to an exterior.

On the other hand, blue light Lr' which is a part of the blue light emitted from the upper surface 2a of the light-emitting element 2 excites the α-SiAlON phosphor as the second phosphor 51 mixed in the adhesive 5 filled in the concave 41 of the lower surface 4b of the phosphor plate 4 to be light Lr that is shifted toward light in a red region of spectrum light, and the light Lr is emitted upward to an exterior of the light-emitting device.

An operation of blue light emitted from the peripheral side surface 2e of the light-emitting element 2 is the same as that in the light-emitting device 300 according to the first embodiment. Therefore because the operation has been described, a further detailed description is omitted.

Because there is also blue light emitted to the exterior without exciting the first phosphor 43 and the second phosphor 51, it is possible for a person to view white color having high color rendering properties by mixture of lights of various wavelengths such as the blue light, the yellow light, the red light and so on.

Meanwhile, in the third embodiment, because the plurality of concaves 41a are provided in the phosphor plate 4', the phosphor plate 4' and the light-emitting element 2 are firmly adhered at position of the plurality of concaves 41a. The adhesive 5 filled in the concaves 41a work as anchor portions adhering the phosphor plate 4' and the light-emitting element 2.

FIGS. 8 and 9 illustrate a light-emitting device according to a fourth embodiment.

The light-emitting device 303 according to the fourth embodiment differs from the light-emitting devices 300, 301, and 302 according to the previous embodiments in that a plurality of light-emitting elements 2 are arranged in a line state, differently from the structure in which each of the light-emitting devices in the previous embodiments includes a single light-emitting element 2.

The light-emitting device 303 includes a large phosphor plate 40" and a first phosphor 43 which may be YAG phosphor contained in the phosphor plate 40", similar to that in the previous embodiments. In the fourth embodiment, five light-emitting elements 2 are mounted on the phosphor plate 40". A concave 41b is provided in a lower surface 40b" of the phosphor plate 40" at a position corresponding to a mounting position of each of the light-emitting elements 2. In this embodiment, four concaves 41b are provided per one light-emitting element 2 (see FIG. 9). That is to say, in the fourth embodiment, twenty concaves 41b in all per five light-emitting elements 2 are provided in the phosphor plate 40", as shown in FIG. 9.

Each of the concaves 41b has a circular shape in top plan and a curved shape in section, and is filled with an adhesive 5 in which a second phosphor 51 which comprises α-SiAlON phosphor is contained. Here, of course, the number of the concaves 41b is not limited to four per one light-emitting element 2.

In addition, in the light-emitting device 303 according to the fourth embodiment, a circuit substrate 8 is provided at the lower surfaces 2b of the light-emitting elements 2, as shown in FIGS. 8 and 9. The circuit substrate 8 has a length longer than that of the phosphor plate 40" and is disposed so that both ends of the circuit substrate 8 are protruded slightly from both ends of the phosphor plate 40". A pair of source electrodes 82 electrically connected to exterior electrodes is provided on an upper surface of the circuit substrate 8 at both end portions of the circuit substrate 8. At an intermediate portion of the circuit substrate 8, four wiring electrodes 81 electrically connected to each of the light-emitting elements 2 are provided. Each of the wiring electrodes 81 is connected to a p-element electrode 3a and an n-element electrode 3b of each light-emitting element 2 to be electrically conducted with each other, as shown in FIGS. 8 and 9.

A peripheral side surface 2e and a lower surface 2b of each of the light-emitting elements 2 are covered by a white resin 6, similarly to the previous embodiments. Moreover, the phosphor plate 40" includes an upper surface 40a", a lower surface 40b" opposite to the upper surface 40a", a peripheral edge 40c" of the upper surface 40a", a peripheral edge 40d" of the lower surface 40b", and a peripheral side surface 40e", similar to the phosphor plate 4 in the first embodiment.

FIGS. 10A to 10C illustrate a manufacturing process of the light-emitting device 303 according to the fourth embodiment.

FIG. 10A illustrates a bonding process to mount five light-emitting elements 2 on the large phosphor plate 40". FIG. 10B illustrates a covering process that covers the peripheral side surface 2e and the lower surface 2b of each of the light-emitting elements 2 with the white resin material of which is supplied from the dropping device 109. The foregoing bonding and covering processes are the same as the corresponding processes to that in the first embodiment as mentioned above. Therefore, identical reference numbers are attached to parts similar to that in the first embodiment, a detailed description is omitted.

FIG. 10C illustrates a combining process that combines the circuit substrate 8 to the light-emitting device 303' after the covering process is completed. In the combining process, the circuit substrate 8 is disposed in a downward direction so that the wiring electrodes 81 and the source electrodes 82 provided on the circuit substrate are arranged to face the five light-emitting elements 2 which are arranged in the line state, and the p-element electrode 3a and the n-element electrode 3b which are the pair of element electrodes of each light-emitting element 2 and the source electrode 82 and the wiring electrode 81 of the circuit substrate 8 are electrically connected. Consequently, the five light-emitting elements 2 are electrically connected in series to the source electrodes 82 disposed on the both end portions of the circuit substrate 8.

A method such as heat adhesion by ultrasonic waves, soldering or the like is applicable to electrically connect the p-element electrode 3a and the n-element electrode 3b of each light-emitting element 2 and the source electrode 82 and the wiring electrode 81 of the circuit substrate 8.

In the light-emitting device 303 according to the fourth embodiment, the five light-emitting elements 2 are connected in series through the wiring electrodes 81 provided on the circuit substrate 8 and can be connected to the exterior electrodes through the source electrodes 82 provided on the both end portions of the circuit substrate 8. Consequently, it is possible to use as a line source having life duration of five times, compared with the light-emitting device including a single light-emitting element 2 by supplying a voltage amount of five light-emitting elements to the source electrodes 82.

In this way, the light-emitting device 303 according to the fourth embodiment makes it possible to improve an illumination function from a point illumination of the light-emitting devices 300, 301, 302 to line illumination. It is also possible to improve the illumination function from the line illumination to a plane illumination by arranging a plurality of light-emitting devices 303 in parallel.

Meanwhile, a light-emitting operation of the light-emitting device 303, in other words, an operation of blue light emitted from the upper surface 2a as the light-emitting surface of each light-emitting element 2 is the approximately same as that in the light-emitting devices 301, 302 according to the second embodiment and the third embodiment, and an operation of blue light emitted from the peripheral side surface 2e of each light-emitting element 2 is the same as that in the light-emitting device 300 according to the first embodiment. From the above, a further detailed description is omitted.

Although the preferred embodiments of the present invention have been, it should be understood that the present invention is not limited to these embodiments, various modifications and changes can be made to the embodiments by those skilled in the art as long as such modifications and changes are within the scope of the present invention as defined by the Claims.

What is claimed is:

1. A light-emitting device comprising:
   a phosphor plate including an upper surface, a lower surface opposite to the upper surface, a peripheral side surface extending between a peripheral edge of the upper surface and a peripheral edge of the lower surface of the phosphor plate;
   a light-emitting element including an upper surface, a lower surface opposite to the upper surface, a peripheral side surface extending between a peripheral edge of the upper surface and a peripheral edge of the lower surface of the light-emitting element; and
   wherein the lower surface of the phosphor plate includes a concave and is disposed on the upper surface of the light-emitting element, and
   the concave included in the lower surface of the phosphor plate is filled with an adhesive and is positioned within the peripheral edge of the upper surface of the light-emitting element in a top plan view.

2. The light-emitting device according to claim 1,
   wherein the phosphor plate contains a first phosphor,
   the adhesive that is filled in the concave of the lower surface of the phosphor plate contains a second phosphor, and the first phosphor contained in the phosphor plate is different from the second phosphor contained in the adhesive that is filled in the concave of the lower surface of the phosphor plate.

3. The light-emitting device according to claim 2, wherein the first phosphor contained in the phosphor plate comprises yttrium aluminum garnet.

4. The light-emitting device according to claim 2, wherein the first phosphor contained in the phosphor plate comprises lutetium aluminum garnet.

5. The light-emitting device according to claim 2, wherein the first phosphor contained in the phosphor plate comprises β-SiAlON.

6. The light-emitting device according to claim 2, wherein the second phosphor contained in the adhesive that is filled in the concave of the lower surface of the phosphor plate comprises $CaAlSiN_3$:Eu.

7. The light-emitting device according to claim 2, wherein the second phosphor contained in the adhesive filled in the concave of the lower surface of the phosphor plate comprises α-SiAlON.

8. The light-emitting device according to claim 1, wherein a center of the concave included in the lower surface of the phosphor plate coincides with a center of the upper surface of the light-emitting element as viewed from above.

9. The light-emitting device according to claim 1, wherein the number of the concave included in the lower surface of the phosphor plate is one.

10. The light-emitting device according to claim 1, wherein the light-emitting element includes a p-element electrode and an n-element electrode that are positioned at the lower surface of the light-emitting element.

11. The light-emitting device according to claim 10, further comprising:
a white resin covering the peripheral side surface of the light-emitting element and the lower surface of the light-emitting element except the p-element electrode and the n-element electrode of the light-emitting element.

12. The light-emitting device according to claim 11, wherein
the lower surface of the phosphor plate is larger in area than the upper surface of the light-emitting element with the peripheral edge of the lower surface of the phosphor plate protruding from the peripheral edge of the upper surface of the light-emitting element; and
the white resin is in contact with the lower surface of the phosphor plate at an area of the lower surface of the phosphor plate that protrudes from the peripheral edge of the upper surface of the light-emitting element, and the white resin is flush with the peripheral side surface of the phosphor plate at a peripheral side surface of the white resin.

13. The light-emitting device according to claim 1, wherein the adhesive filled in the concave provided in the lower surface of the phosphor plate is transparent.

14. The light-emitting device according to claim 1, wherein the number of the concave included in the lower surface of the phosphor plate is one or more.

15. The light-emitting device according to claim 14, wherein
the concaves are lined up along the peripheral edge of the upper surface of the light-emitting element in a top plan view.

16. The light-emitting device according to claim 14, wherein the phosphor plate contains a first phosphor, and the adhesive filled in the concaves of the lower surface of the phosphor plate contains a second phosphor that is different from the first phosphor included in the phosphor plate.

17. A light-emitting device comprising:
a phosphor plate including an upper surface, a lower surface opposite to the upper surface, a peripheral side surface extending between a peripheral edge of the upper surface and a peripheral edge of the lower surface of the phosphor plate;
a light-emitting element including an upper surface, a lower surface opposite to the upper surface, a peripheral side surface extending between a peripheral edge of the upper surface and a peripheral edge of the lower surface of the light-emitting element; and
wherein the lower surface of the phosphor plate includes concaves and is disposed on the upper surface of the light-emitting element, and
the concaves included in the lower surface of the phosphor plate are filled with an adhesive and at least one of the concaves is positioned within the peripheral edge of the upper surface of the light-emitting element in a top plan view.

18. The light-emitting device according to claim 17, wherein the phosphor plate contains a first phosphor, the adhesive that is filled in the concaves of the lower surface of the phosphor plate contains a second phosphor, and the first phosphor contained in the phosphor plate is different from the second phosphor contained in the adhesive that is filled in the concaves of the lower surface of the phosphor plate.

19. A light-emitting device comprising:
a phosphor plate including an upper surface, a lower surface opposite to the upper surface, a peripheral side surface extending between a peripheral edge of the upper surface and a peripheral edge of the lower surface of the phosphor plate;
a plurality of light-emitting elements each including an upper surface, a lower surface opposite to the upper surface, a peripheral side surface extending between a peripheral edge of the upper surface and a peripheral edge of the lower surface of the each light-emitting element; and
wherein the lower surface of the phosphor plate includes a plurality of concaves and is disposed on the upper surfaces of the plurality of light-emitting elements, and
the concaves included in the lower surface of the phosphor plate are filled with an adhesive and at least one of the concaves is positioned within the peripheral edge of the upper surface of at least one of the light-emitting elements in a top plan view.

* * * * *

UNITED STATES PATENT AND TRADEMARK OFFICE
CERTIFICATE OF CORRECTION

| | |
|---|---|
| PATENT NO. | : 8,853,934 B2 |
| APPLICATION NO. | : 13/651805 |
| DATED | : October 7, 2014 |
| INVENTOR(S) | : Nodoka Oyamada |

It is certified that error appears in the above-identified patent and that said Letters Patent is hereby corrected as shown below:

IN THE CLAIMS
At claim 5, column 13, line 13, delete "ß-SiAION" and insert --ß-SiAlON--.
At claim 6, column 13, line 17, delete "CaAISiN$_3$:Eu" and insert --CaAlSiN$_3$:Eu--.
At claim 7, column 13, line 21, delete "ß-SiAION" and insert --ß-SiAlON--.

Signed and Sealed this
Twenty-third Day of June, 2015

Michelle K. Lee
*Director of the United States Patent and Trademark Office*

UNITED STATES PATENT AND TRADEMARK OFFICE
CERTIFICATE OF CORRECTION

PATENT NO. : 8,853,934 B2
APPLICATION NO. : 13/651805
DATED : October 7, 2014
INVENTOR(S) : Nodoka Oyamada It is certified that error appears in the above-identified patent and that said Letters Patent is hereby corrected as shown below:

At claim 7, column 13, line 22, delete "α-SiAION" and insert -- α-SiAlON --.

Signed and Sealed this
Ninth Day of August, 2016

Michelle K. Lee
*Director of the United States Patent and Trademark Office*